(12) United States Patent
Zhang

(10) Patent No.: US 11,877,453 B2
(45) Date of Patent: *Jan. 16, 2024

(54) THREE-DIMENSIONAL MEMORY DEVICES AND FABRICATING METHODS THEREOF

(71) Applicant: Yangtze Memory Technologies Co., Ltd., Hubei (CN)

(72) Inventor: Kun Zhang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 141 days.

This patent is subject to a terminal disclaimer.

(21) Appl. No.: 17/214,390

(22) Filed: Mar. 26, 2021

(65) Prior Publication Data

US 2021/0217772 A1    Jul. 15, 2021

Related U.S. Application Data

(60) Division of application No. 16/219,994, filed on Dec. 14, 2018, now Pat. No. 11,024,641, which is a continuation of application No. PCT/CN2018/111554, filed on Oct. 24, 2018.

(51) Int. Cl.
| | |
|---|---|
| *H01L 27/11582* | (2017.01) |
| *H01L 27/11519* | (2017.01) |
| *H10B 43/27* | (2023.01) |
| *H10B 41/10* | (2023.01) |
| *H10B 41/27* | (2023.01) |
| *H10B 43/10* | (2023.01) |
| H10B 41/35 | (2023.01) |
| H10B 43/35 | (2023.01) |

(52) U.S. Cl.
CPC ............. *H10B 43/27* (2023.02); *H10B 41/10* (2023.02); *H10B 41/27* (2023.02); *H10B 43/10* (2023.02); H10B 41/35 (2023.02); H10B 43/35 (2023.02)

(58) Field of Classification Search
None
See application file for complete search history.

(56) References Cited

U.S. PATENT DOCUMENTS

| | | |
|---|---|---|
| 8,072,018 B2 | 12/2011 | Chen et al. |
| 8,470,671 B1 | 6/2013 | Lin et al. |
| 8,552,489 B2 | 10/2013 | Eom et al. |

(Continued)

FOREIGN PATENT DOCUMENTS

| | | |
|---|---|---|
| CN | 101800224 A | 8/2010 |
| CN | 106910746 A | 6/2017 |

(Continued)

OTHER PUBLICATIONS

U.S. Appl. No. 17/212,754, filed 2021. (Year: 2021).*

(Continued)

*Primary Examiner* — Asok K Sarkar
(74) *Attorney, Agent, or Firm* — Sterne, Kessler, Goldstein & Fox P.L.L.C.

(57) ABSTRACT

A three-dimensional (3D) memory device is disclosed. The 3D memory device comprises an alternating layer stack on a substrate, a plurality of channel holes penetrating the alternating layer stack, a channel structure in each channel hole, and a top selective gate cut structure having a laminated structure and located between two rows of channel structures.

8 Claims, 15 Drawing Sheets

(56) References Cited

U.S. PATENT DOCUMENTS

| | | |
|---|---|---|
| 8,704,301 B2 | 4/2014 | Blanchard |
| 8,821,752 B2 | 9/2014 | Cho et al. |
| 9,230,974 B1 | 1/2016 | Pachamuthu et al. |
| 9,230,982 B1 | 1/2016 | Yuan et al. |
| 9,397,111 B1 | 7/2016 | Chowdhury et al. |
| 9,899,401 B2 | 2/2018 | Seol et al. |
| 11,024,641 B2 | 6/2021 | Zhang |
| 2013/0140623 A1 | 6/2013 | Lee et al. |
| 2013/0248974 A1 | 9/2013 | Alsmeier et al. |
| 2015/0200203 A1 | 7/2015 | Jang et al. |
| 2015/0340376 A1 | 11/2015 | Park et al. |
| 2016/0093631 A1 | 3/2016 | Yun et al. |
| 2016/0225785 A1 | 8/2016 | Kim et al. |
| 2016/0260735 A1 | 9/2016 | Lee et al. |
| 2017/0018437 A1 | 1/2017 | Greene et al. |
| 2017/0077108 A1 | 3/2017 | Kawaguchi et al. |
| 2017/0213845 A1 | 7/2017 | Baba |
| 2018/0247949 A1 | 8/2018 | Choi |
| 2018/0277556 A1 | 9/2018 | Kang |
| 2019/0057974 A1 | 2/2019 | Lu et al. |
| 2020/0135753 A1 | 4/2020 | Zhang |

FOREIGN PATENT DOCUMENTS

| | | |
|---|---|---|
| CN | 107482013 A | 12/2017 |
| CN | 107731846 A | 2/2018 |
| CN | 108028255 A | 5/2018 |
| TW | 200832704 A | 8/2008 |
| TW | 200903776 A | 1/2009 |
| TW | 201331343 A | 8/2013 |
| TW | 201403750 A | 1/2014 |
| WO | WO 2019/042037 A1 | 3/2019 |
| WO | WO 2019/042071 A1 | 3/2019 |

OTHER PUBLICATIONS

International Search Report and Written Opinion of the International Searching Authority directed to related International Patent Application No. PCT/CN2018/111554, dated Jul. 29, 2019; 8 pages.

\* cited by examiner

THREE-DIMENSIONAL MEMORY DEVICES AND FABRICATING METHODS THEREOF

CROSS-REFERENCE TO RELATED APPLICATIONS

This application is a divisional application of U.S. patent application Ser. No. 16/219,994, filed on Dec. 14, 2018, which claims priority to International Patent Application No. PCT/CN2018/11554, filed on Oct. 24, 2018, which are incorporated herein by references in their entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, a memory finger includes nine rows of channel holes arranged in a staggered manner, which requires a large wafer. It is a challenge to reduce the size of the wafer without changing the storage capacity, and thereby reducing the size of the 3D NAND memory devices.

BRIEF SUMMARY

Embodiments of three-dimensional (3D) memory devices and fabricating methods thereof are disclosed herein.

One aspect of the present disclosure provides a method for forming a three-dimensional (3D) memory device. The method can comprises: forming an alternating dielectric stack on a substrate; forming a temporary top selective gate cut in an upper portion of the alternating dielectric stack and extending along a lateral direction; forming a plurality of channel holes penetrating the alternating dielectric stack; removing the temporary top selective gate cut; and forming, simultaneously, a plurality of channel structures in the plurality of channel holes and a top selective gate cut structure.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, forming the temporary top selective gate cut comprises: forming a trench in an upper portion of the alternating dielectric stack and extending along the lateral direction; and forming a sacrificial wall in the trench.

In some embodiments, forming the trench comprises: etching top three dielectric layer pairs of the alternating dielectric stack to form the trench.

In some embodiments, forming the sacrificial wall comprises: disposing a filling material into the trench to form the sacrificial wall; wherein the filling material is stable physically and chemically within a temperature range between about 200° C. to about 400° C.

In some embodiments, disposing the filling material comprises depositing a carbonaceous inorganic substance mixed with a solvent.

In some embodiments, removing the temporary top selective gate cut comprises: performing an ashing process to simultaneously clean the plurality of channel holes and remove the sacrificial wall.

In some embodiments, simultaneously forming the plurality of channel structures and the top selective gate cut structure comprises: simultaneously forming a functional layer on sidewalls of the plurality of channel holes and forming a dummy functional layer on sidewalls of the trench, followed by; simultaneously forming a channel layer covering the functional layer in each channel hole and forming a dummy channel layer covering the dummy functional layer in the trench, followed by; simultaneously forming a dielectric filling structure filling each channel hole and forming a dielectric filling wall filling the trench, followed by; and simultaneously forming a channel plug on a top portion of each channel hole on the dielectric filling wall and forming a dummy channel strip cover on the dielectric filling wall in the trench.

In some embodiments, the method further comprises: before forming the functional layer, forming an epitaxial layer on a surface of the substrate that is exposed by the plurality of channel holes. In some embodiments, the channel layer is in contact with the epitaxial layer in each channel hole; each channel structure includes the epitaxial layer, the functional layer, the channel layer, the dielectric filling structure, and the channel plug; and the top selective gate cut structure includes the dummy functional layer, the dummy channel layer, the dielectric filling wall, and the dummy channel strip cover.

In some embodiments, simultaneously forming the functional layer and the dummy functional layer comprises: simultaneously forming a barrier layer on the sidewalls of the plurality of channel holes and forming a dummy barrier layer on the sidewalls of the trench, followed by; simultaneously forming a storage layer on a surface of the barrier layer in each channel hole and forming a dummy storage layer on a surface of the dummy barrier layer in the trench, followed by; and simultaneously forming a tunneling layer on a surface of the storage layer in each channel hole and forming a dummy tunneling layer on a surface of the dummy storage layer in the trench.

In some embodiments, the method further comprises: forming a pair of slits penetrating the alternating dielectric stack, the pair of slits being extended in parallel along the lateral direction. In some embodiments, a number N of rows of channel structures are formed between the pair of slits, wherein each row of channel structures are arranged staggered with adjacent row of channel structures, and N is an even number; and the top selective gate cut structure is formed between number N/2 row of channel structures and number N/2+1 row of channel structures.

In some embodiments, the method further comprises: replacing the second dielectric layers in the alternating dielectric with conductive layers.

Another aspect of the present disclosure provides a three-dimensional (3D) memory device, comprising: an alternating layer stack on a substrate; a plurality of channel holes penetrating the alternating layer stack; a channel structure in each channel hole; and a top selective gate cut structure having a laminated structure and located between two rows of channel structures.

In some embodiments, the alternating layer stack comprises: at least 32 conductive/dielectric layer pairs stacked in a vertical direction, wherein each conductive/dielectric pair includes a dielectric layer and a conductive layer.

In some embodiments, the top selective gate cut structure extends into three top conductive/dielectric layer pairs of the alternating layer stack.

In some embodiments, the channel structure comprises: an epitaxial layer on a bottom of the channel hole; a functional layer on a sidewall of the channel hole; a channel layer covering a sidewall of the functional layer and being in contact with the epitaxial layer; a dielectric filling structure covering a sidewall of the channel layer and filling the channel hole; and a channel plug on a top portion of the channel hole.

In some embodiments, the top selective gate cut structure comprises: a dummy functional layer covering sidewalls and a bottom of a trench; a dummy channel layer covering the dummy functional layer; a dielectric filling wall, and a dummy channel strip cover on a top portion of the trench.

In some embodiments, the functional layer and the dummy functional layer have a same material and are formed in a same process; the channel layer and the dummy channel layer have a same material and are formed in a same process; a dielectric filling structure and the dielectric filling wall have a same material and are formed in a same process; and the channel plug and the dummy channel strip cover have a same material and are formed in a same process.

In some embodiments, the functional layer comprises: a barrier layer on the sidewall of the first channel hole configured to block an outflow of electronic charges; a storage layer on a surface of the first barrier layer configured to store electronic charges during operation of the 3D memory device; and a tunneling layer on a surface of the first storage layer configured to tunnel electronic charges.

In some embodiments, the device further comprises: a pair of slits penetrating the alternating layer stack, the pair of slits being extended in parallel along the lateral direction. In some embodiments, a number N of rows of channel structures are located between the pair of slits, each row of channel structures are arranged staggered with adjacent row of channel structures, and N is an even number; and the top selective gate cut structure is located between number N/2 row of channel structures and number N/2+1 row of channel structures.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1B:
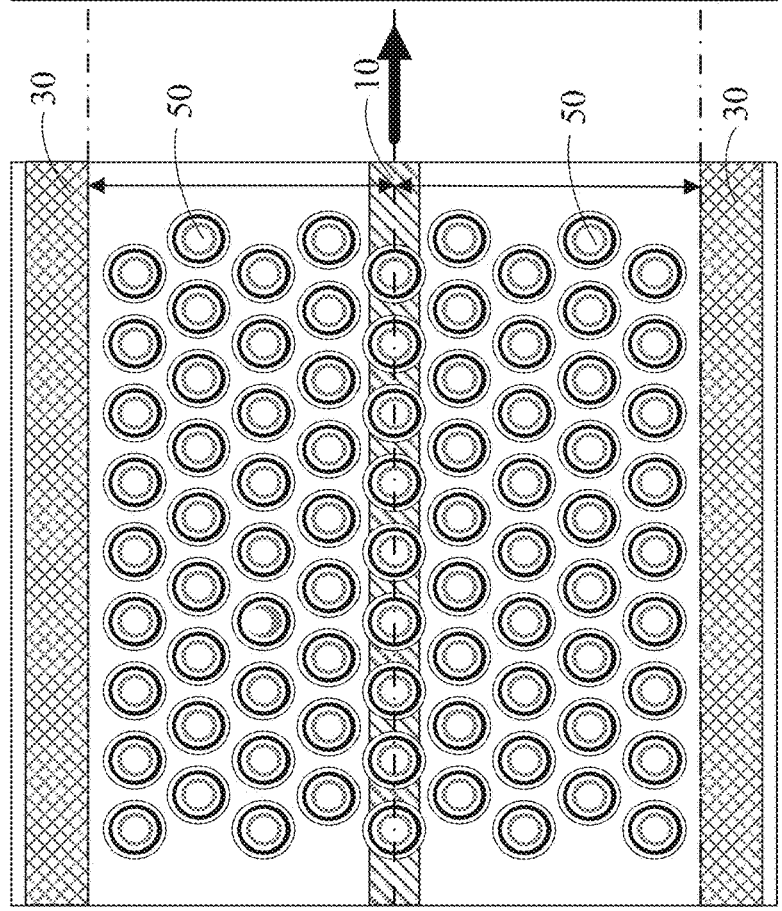
FIG. 1(B) illustrates a top view of an exemplary 3D memory device in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of lateral planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a method for forming a 3D memory device with a top selective gate cut structure for a memory array (also referred to herein as an "array device").

Figure 1A:
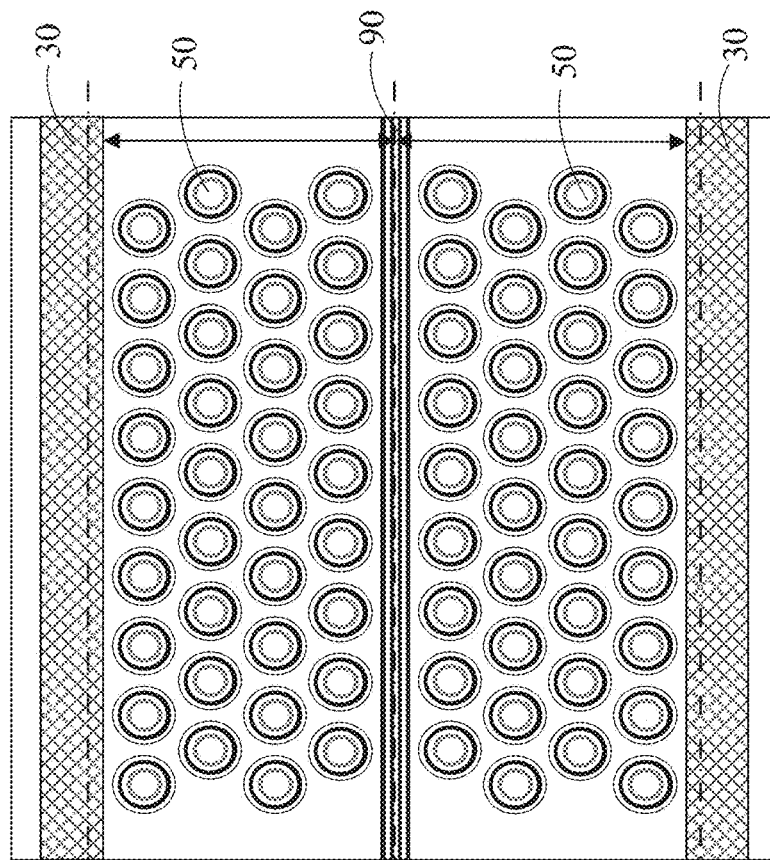
FIG. 1(A) illustrates a top view of an exemplary 3D memory device.

Referring to FIG. 1(A), a schematic diagram of a 3D memory device is shown in a top view. As shown, in some existing 3D NAND memory devices, multiple slits 30 can be extended in parallel along a lateral direction to divide the memory array into multiple memory fingers. Each memory finger can include nine rows of channel structures 50 arranged in a staggered manner between two adjacent slits 30. A top selective gate (TSG) cut 10 is located in the middle of the memory finger to separate the memory finger into two equal parts. Due to the size limitation, the top selective gate cut 10 occupies the locations of the fifth row of the nine rows of channel structures 50.

Referring to FIG. 1(B), a schematic diagram of a 3D memory device according to some embodiments of the present disclosure is shown in a top view. In some embodiments, an even number N (e.g., 8) rows of channel structures 50 can be arranged in a staggered manner between neighboring slits 30. The TSG cut structure 90 can be located between the number N/2 row (e.g., fourth row) and the number N/2+1 row (e.g., fifth row) of channel structures 50, such that the total channel structures 50 between neighboring slits 30 are separated into two equal groups.

The TSG cut structure 90 can extend laterally in the X-direction. In some embodiments, as shown in FIG. 1(B), the TSG cut structure 90 can have a strip shape. In some other embodiments, the TSG cut structure 90 can have a wavy shape (not shown). In some embodiments, a width of the top selective gate cut 90 can be in a range from about 10 nm to about 110 nm, which is less than a diameter of each channel structure 50 in a lateral direction. As such, without occupying the location of a row of channel structures 50, the TSG cut can be arranged between adjacent channel structures 50. For example, the arrangement of nine rows of channel structures 50 in a memory finger of the 3D memory device as shown in FIG. 1(A) can be changed to the arrangement of eight rows of channel structures 50 in a memory finger of the 3D memory device as shown in FIG. 1(B).

By reducing the number of channel structures 50 in each memory finger, the channel hole pattern density can be decreased during the formation of the channel structures 50. Accordingly, an area of each memory finger can be reduced about 5%-10%. Therefore, the size requirement of the wafer can be decreased without lowing the storage capacity, which thereby results in a reduced size of the 3D NAND memory device, and a reduced cost. Further, the reduced area of each memory finger can facilitate the gate replacement process during the formation of word lines by decreasing a removal over etch rate, and resulting in a decreased process cycle time.

Figure 2:
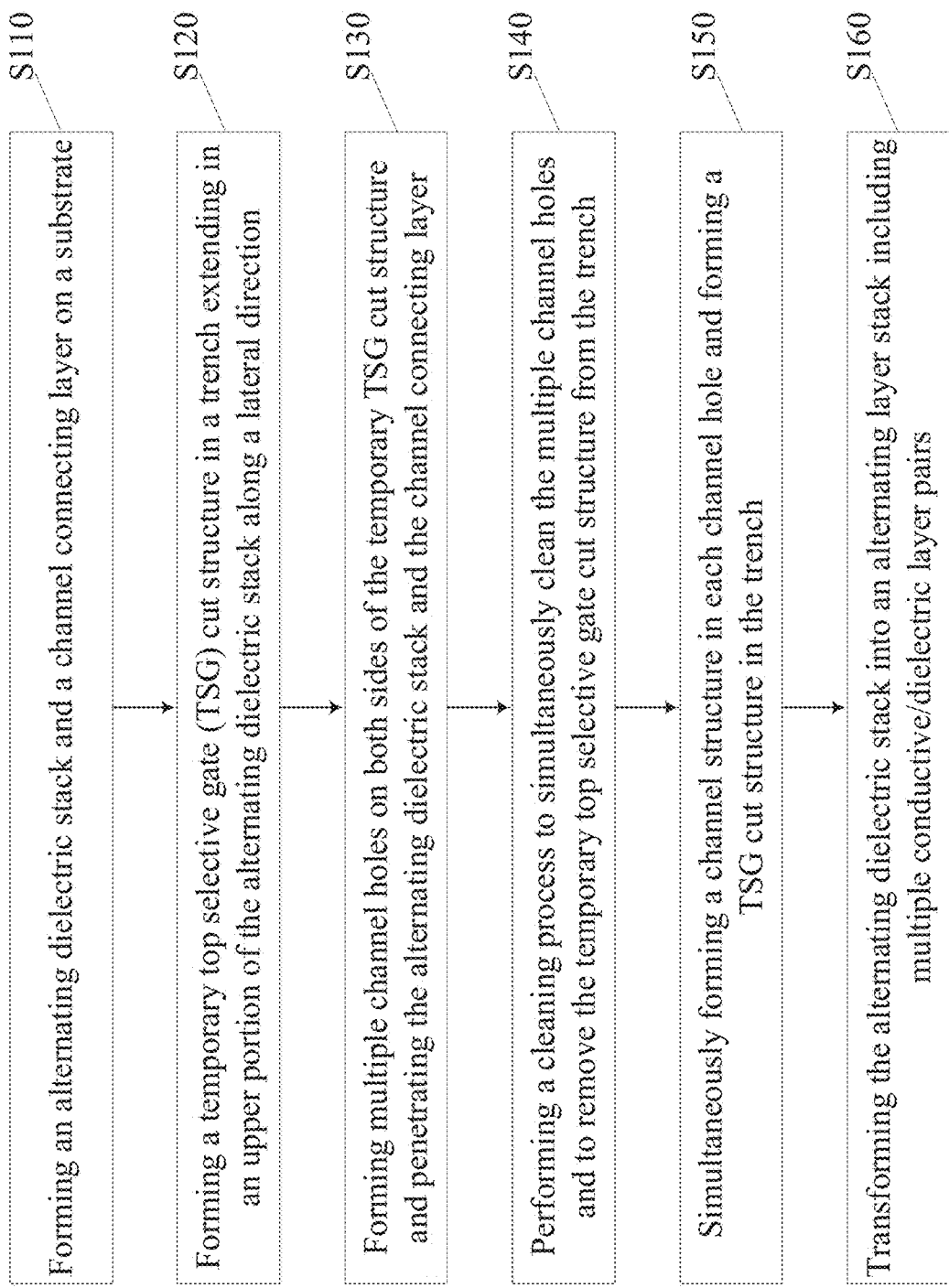
FIG. 2 illustrates a flow diagram of an exemplary method for forming a 3D memory device in accordance with some embodiments of the present disclosure.

Referring to FIG. 2, a flow diagram of an exemplary method for forming a 3D memory device is shown in accordance with some embodiments of the present disclosure. FIGS. 3-15 illustrate cross-sectional views of an exemplary 3D memory device at certain fabricating stages of the method shown in FIG. 2.

As shown in FIG. 2, the method can start at operation S110, in which an alternating dielectric stack and a channel connecting layer can be formed on a substrate.

Figure 3:
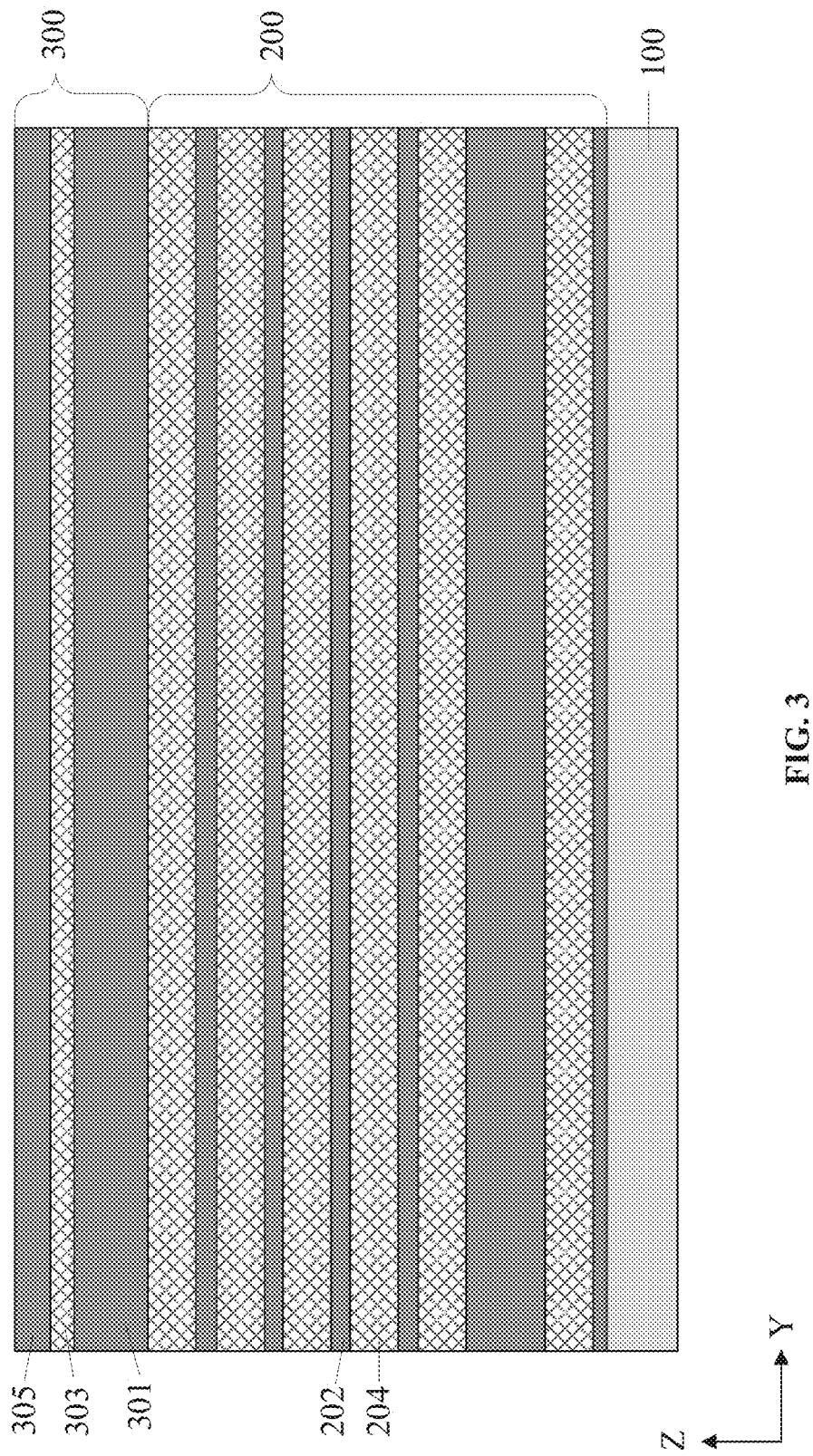
FIGS. 3-15 illustrate cross-sectional views of an exemplary 3D memory device at certain fabricating stages of the method shown in FIG. 2.

As shown in FIG. 3, in some embodiments, the substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc.

The alternating dielectric stack 200 including a plurality of dielectric layer pairs can be formed on the substrate 100. The alternating dielectric stack 200 can include an alternating stack of a first dielectric layer 202 (e.g., silicon oxide) and a second dielectric layer 204 (e.g., silicon nitride) that is different from first dielectric layer, for example. The plurality of first dielectric layers 202 and second dielectric layers 204 are extended in a lateral direction that is parallel to the surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 200 can include a plurality of Silicon oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in the alternating dielectric stack 200, multiple oxide layers 202 (shown in the areas with solid gray) and multiple nitride layers 204 (shown in the areas with meshes) alternate in a vertical direction. In other words, except a top and a bottom layer of a given alternating oxide/nitride stack, each of the other oxide layers 202 can be sandwiched by two adjacent nitride layers 204, and each of the nitride layers 204 can be sandwiched by two adjacent oxide layers 202.

Oxide layers can each have the same thickness or have different thicknesses. For example, a thickness of each oxide layer can be in a range from 10 nm to 100 nm, preferably about 25 nm. Similarly, nitride layers can each have the same thickness or have different thicknesses. For example, a thickness of each nitride layer can be in a range from 10 nm to 100 nm, preferably about 35 nm.

It is noted that, in the present disclosure, the oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 202 and the nitride layers 204. In some embodiments, a total number of layers of the oxide layers 202 and the nitride layers 204 in the alternating dielectric stack 200 is equal to or larger than 64. That is, a number of oxide/nitride layer pairs can be equal to or larger than 32. In some embodiments, the alternating oxide/nitride stack 200 includes more oxide layers or more nitride layers with different materials and/or thicknesses than the oxide/nitride layer pair.

The channel connecting layer 300 can be formed on the alternating dielectric stack 200. In some embodiments, the channel connecting layer 300 can include a first insulating layer 301, a second insulating layer 303, and a third insulating layer 305. The first insulating layer 301, the second insulating layer 303, and the third insulating layer 305 can be made by any suitable insulating material and/or dielectric material. In some embodiments, the material of the first insulating layer 301 and the material of the third insulating layer 305 can include silicon oxide, and the material of the second insulating layer 303 can include silicon nitride.

In some embodiments, the alternating dielectric stack 200 and/or the channel connecting layer 300 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Referring back to FIG. 2, in a next operation S120, a temporary top selective gate (TSG) cut structure can be formed in a trench extending in an upper portion of the alternating dielectric stack and extending along a lateral direction.

Figure 4:
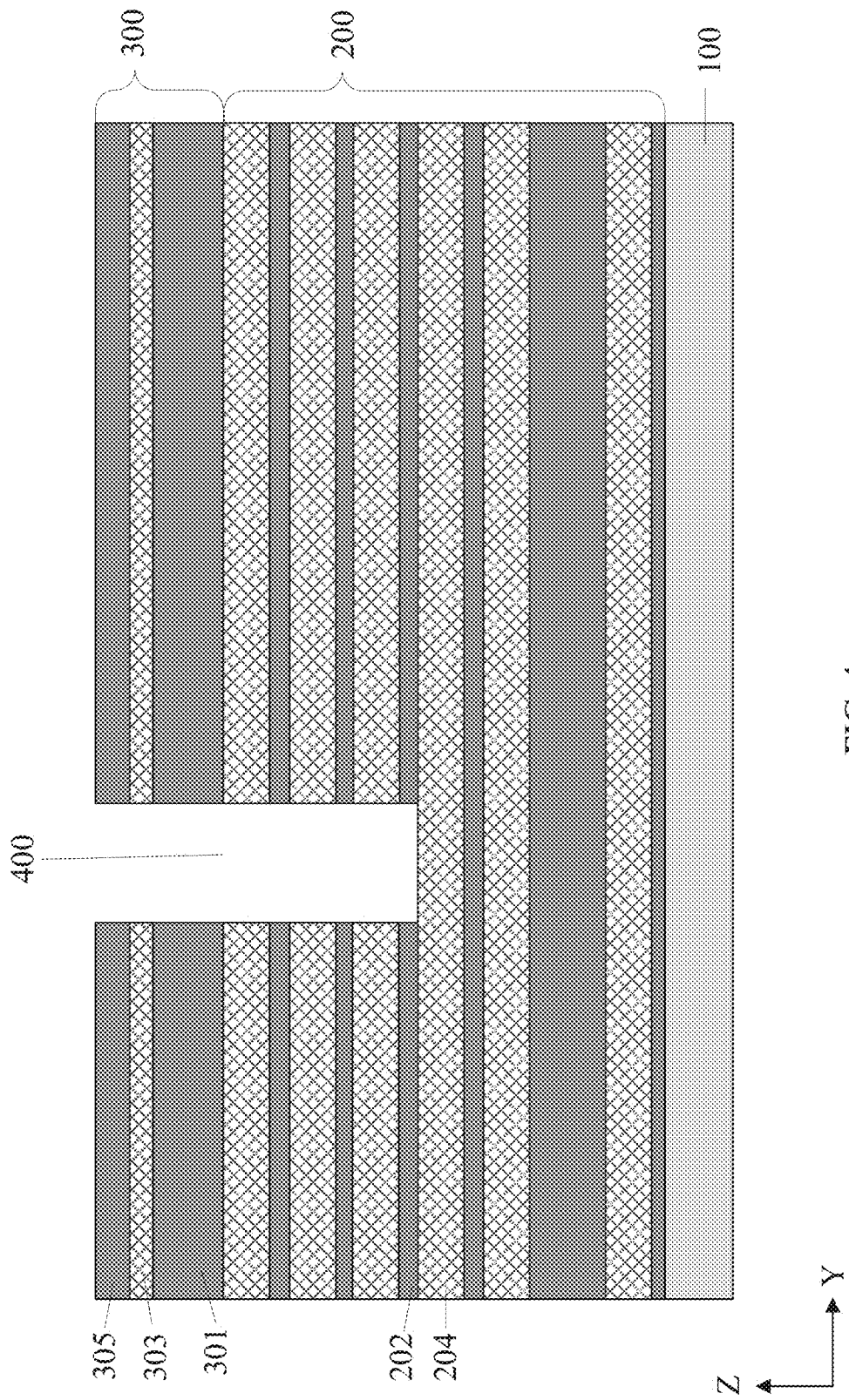

In some embodiments, fabricating process for forming the temporary TSG cut structure can include forming a trench penetrating the channel connecting layer, extending into an upper portion of the alternating dielectric stack, and extending along a lateral direction. As shown in FIG. 4, the trench 400 can completely penetrate the channel connecting layer 300 and can extend into an upper portion of the alternating dielectric stack 200. In some embodiments, the trench 400 can extend penetrate top three oxide/nitride layer pairs of the alternating dielectric stack 200. Note that, the trench 400 is extended along a lateral direction that is perpendicular to the cross-sectional surface shown in FIG. 4. In some embodiments, the trench 400 can be formed by etching the channel connecting layer 300 and the upper portion of the alternating dielectric stack 200. The etching process to form the trench 400 can be a dry etching, a wet etching, or a combination thereof.

Figure 5:
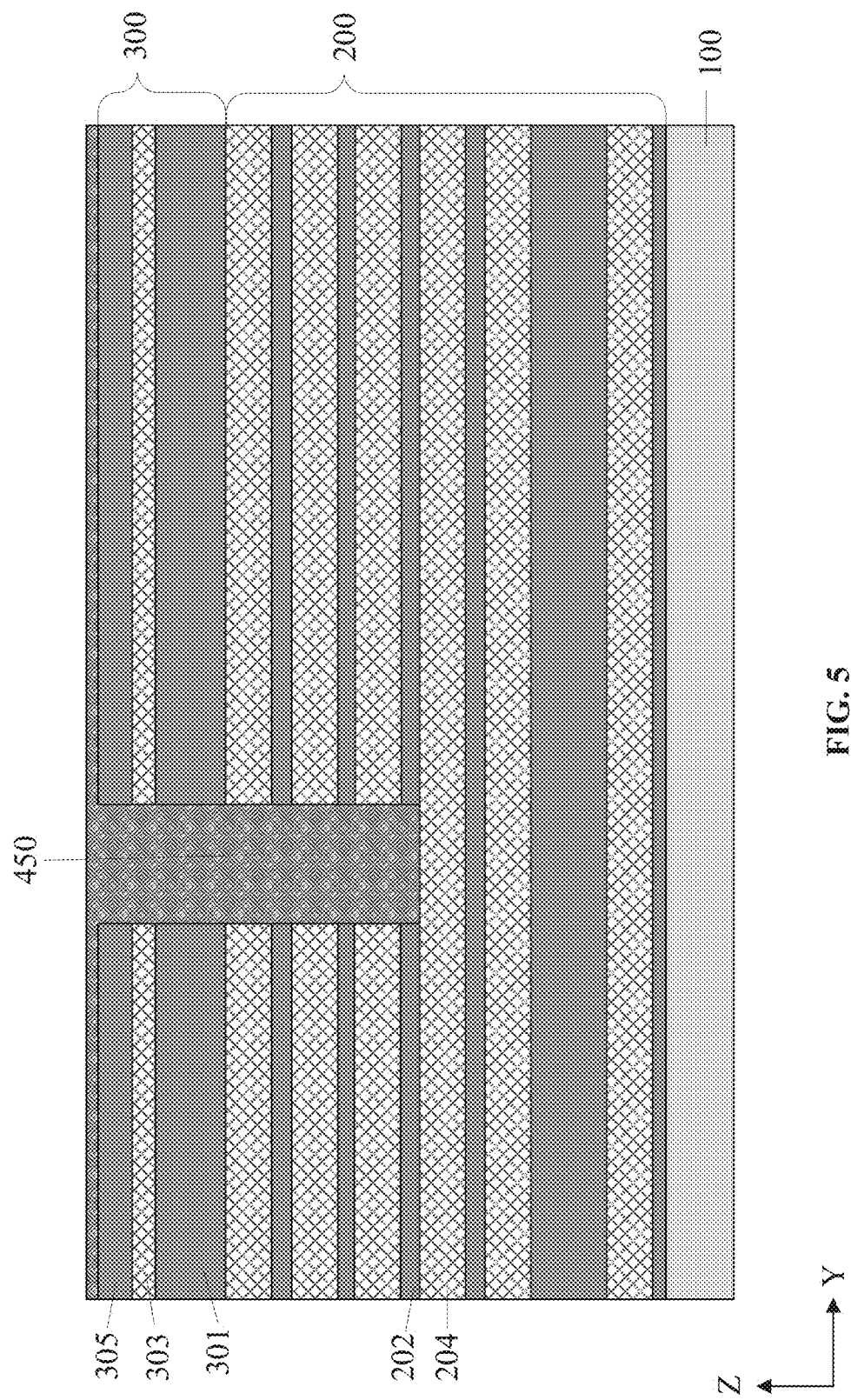

In some embodiments, fabricating process for forming the temporary TSG cut structure can further include forming a sacrificial wall in the trench. As shown in FIG. 5, the sacrificial wall 450 can be formed by filling the trench 400 by depositing a filling material. In some embodiments, the filling material can be a high temperature resistant material that is stable physically and chemically at a high temperature, such as a temperature between about 200° C. to about 400° C. In some embodiments, the filling material can be a carbonaceous inorganic substance mixed with any suitable solvent. For example, the filling material can be Spin On Carbon (SOC). In some embodiments, the filling material can be easily removed by a cleaning process, such as an ashing process and/or a strip process. It is noted that, in some embodiments, the filling material may also be coated on the top surface of the channel connecting layer 300 during the depositing process for forming the sacrificial wall 450 in the trench 400.

Referring back to FIG. 2, in a next operation S130, multiple channel holes can be formed on both sides of the temporary TSG cut structure and penetrating the alternating dielectric stack and the channel connecting layer.

Figure 6:
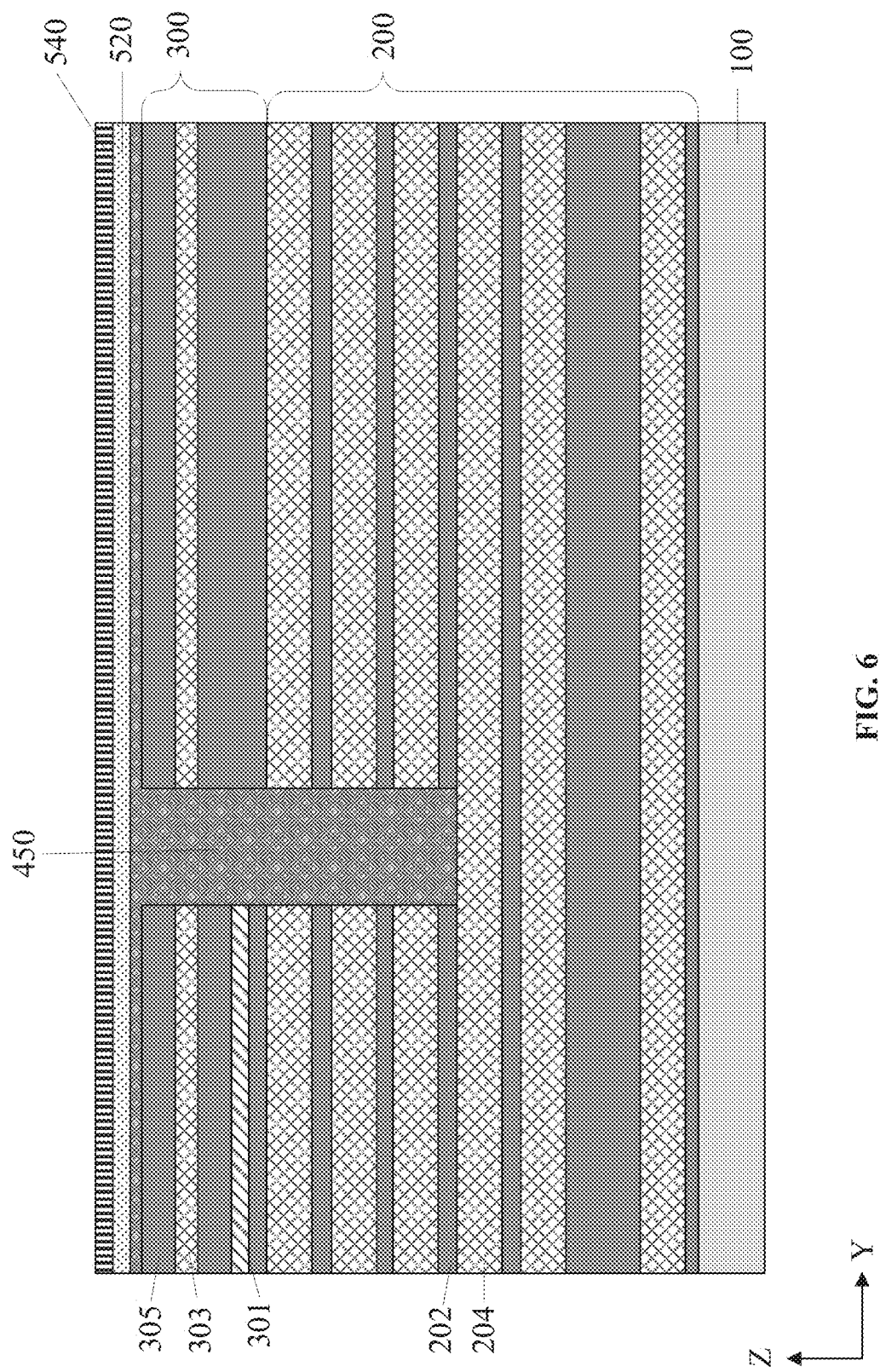
Figure 7:
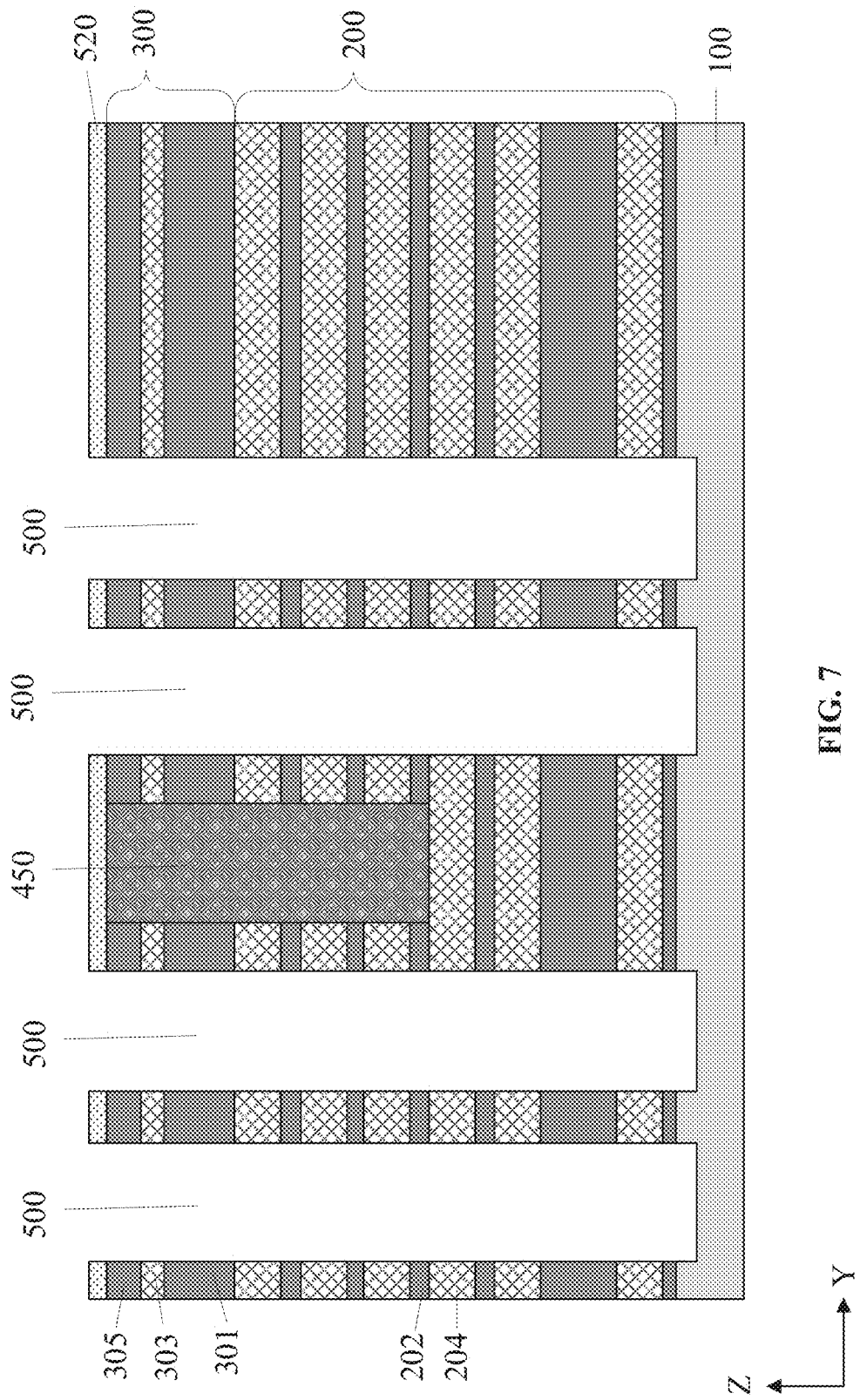

In some embodiments, fabricating process for forming the multiple channel holes 500 can include forming a hard mask layer 520 on the channel connecting layer 300, and coating a photoresist layer 540 on the hard mask layer, as shown in FIG. 6. In some embodiments, fabricating process for forming the multiple channel holes 500 can further include etching the channel connecting layer 300 and the alternating dielectric stack 200 to form the multiple channel holes 500 that are located on both sides of the sacrificial wall 450. As shown in FIG. 7, each channel hole 500 can completely penetrate the channel connecting layer 300 and the alternating dielectric stack 200, and can extend into the substrate 100. The etching process to form the multiple channel holes 500 can be a dry etching, a wet etching, or a combination thereof. After the etching process, the photoresist layer 540 and the hard mask layer 520 can be removed.

In some embodiments, the multiple channel holes 500 can be form and arranged in a staggered array form. For example, as shown in the top view in FIG. 1(B), each row of channel holes 500 can be staggered with its neighboring rows of channel holes 500. Further, in some embodiments, there can be eight rows of channel holes 500 in each memory finger. That is, as shown in FIG. 1(B), eight rows of channel holes 500 can be formed between two neighboring slits 30. Four rows of channel holes 500 are formed on each side of the sacrificial wall 450, which corresponds to TSG cut 10 in FIG. 1(B).

Referring back to FIG. 2, in a next operation S140, a cleaning process can be performed to simultaneously clean the multiple channel holes and to remove the temporary top selective gate cut structure from the trench.

In some embodiments, the cleaning process can include an ashing process, such as a plasma ashing process. For example, a plasma source can be used to generate a reactive species, such as oxygen or fluorine. The reactive species can combine with the photoresist remained in the channel holes 500 to form ash, which can be removed with a vacuum pump. Specifically, in some embodiments, monatomic oxygen plasma can be created by exposing oxygen gas at a low pressure to high power radio waves, which ionise the oxygen gas. The residue of the reaction between the oxygen and photoresist material can generate ash in the plasma asher. The byproducts of the ashing process, such as volatile carbon oxides, water vapor can be pumped away with the vacuum pump within the plasma asher.

Figure 8:
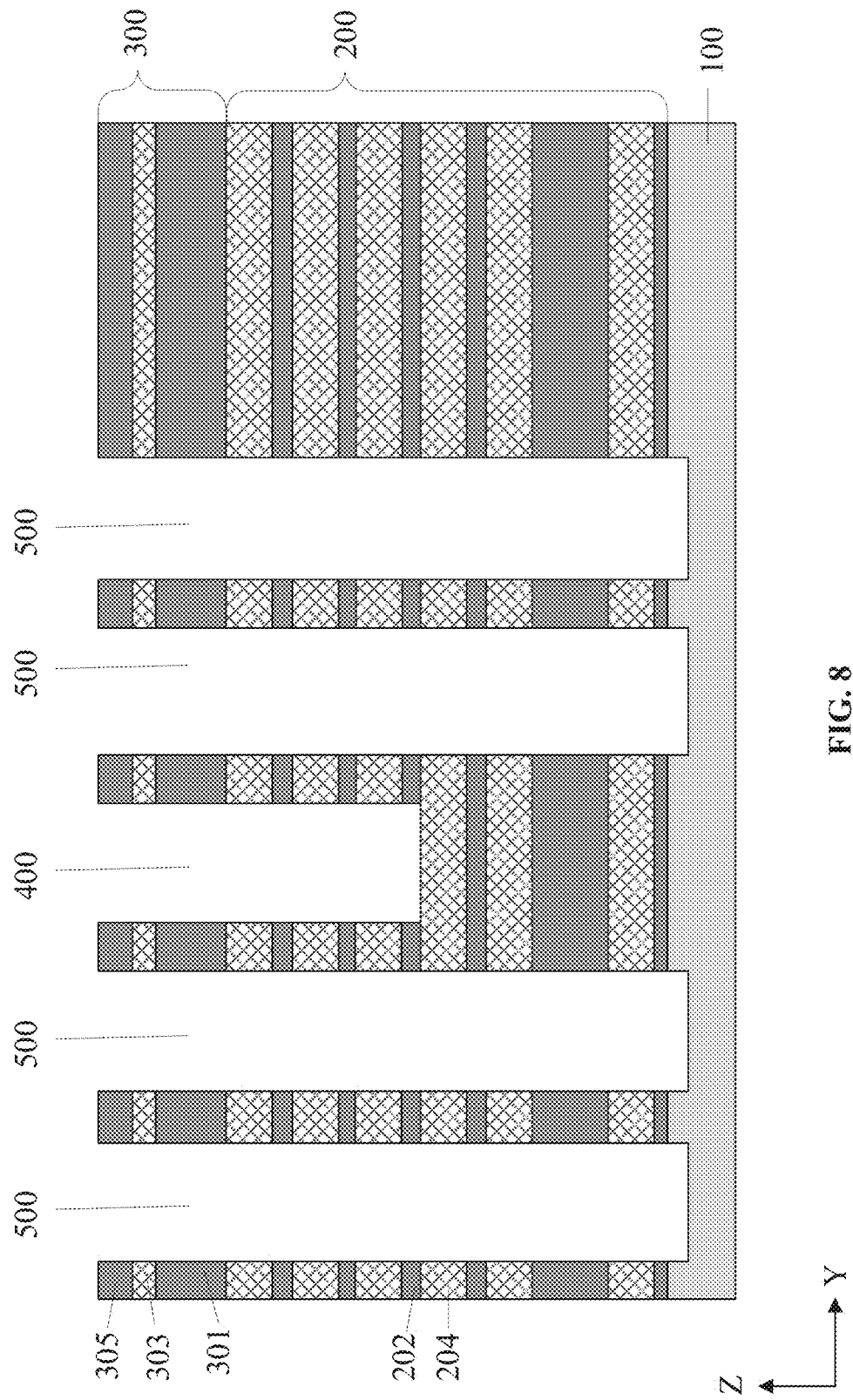

In some embodiments, the ashing process can include a high temperature ashing, and/or a wet stripping. A temperature of the ashing process can be higher than 200° C. Note that, the filling material of the sacrificial wall 450 can also be combined with the reactive species during the ashing process. As such, the sacrificial wall 450 can be removed from the trench 400 by the ashing process, as shown in FIG. 8.

Referring back to FIG. 2, in a next operation S150, a channel structure can be formed in each channel hole, while a TSG cut structure can be formed in the trench simultaneously.

Figure 13:
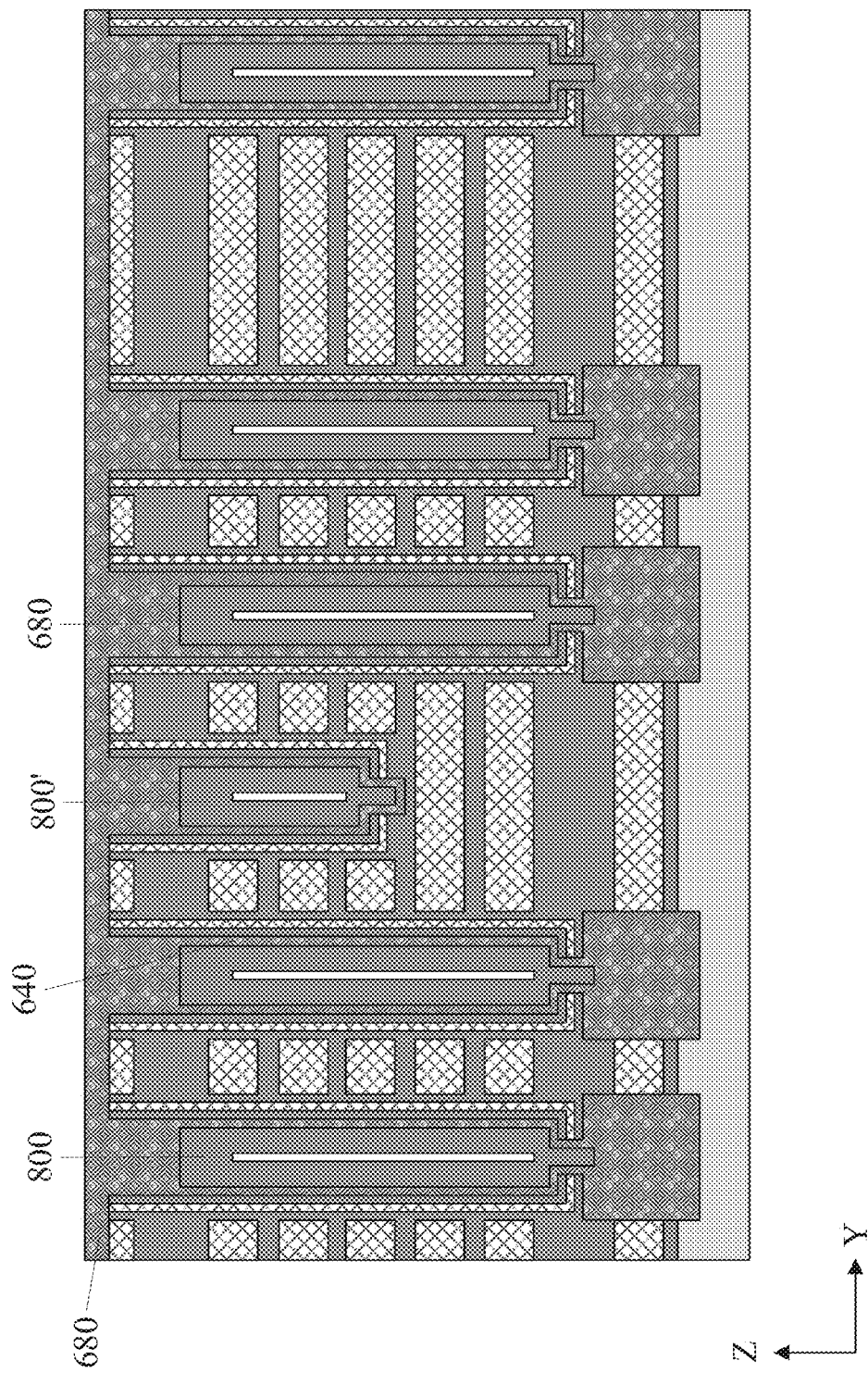

In some embodiments, a channel structure 50 can be formed in each channel hole 500. As shown in FIG. 13, the channel structure 50 can include an epitaxial layer 620 on the bottom of the channel hole 5, a functional layer 700 on the sidewall of the channel hole 500, and a dielectric filling structure 800 in the channel hole 500, a channel layer 640 between the functional layer 700 and the dielectric filling structure 800, and a channel plug 660 on the top portion of the channel hole 500. The functional layer 700 can include a barrier layer 720, a storage layer 740, and a tunneling layer 760. As shown in FIG. 1(B), the functional layer 700 can have a multilayer-ring structure.

Figure 15:
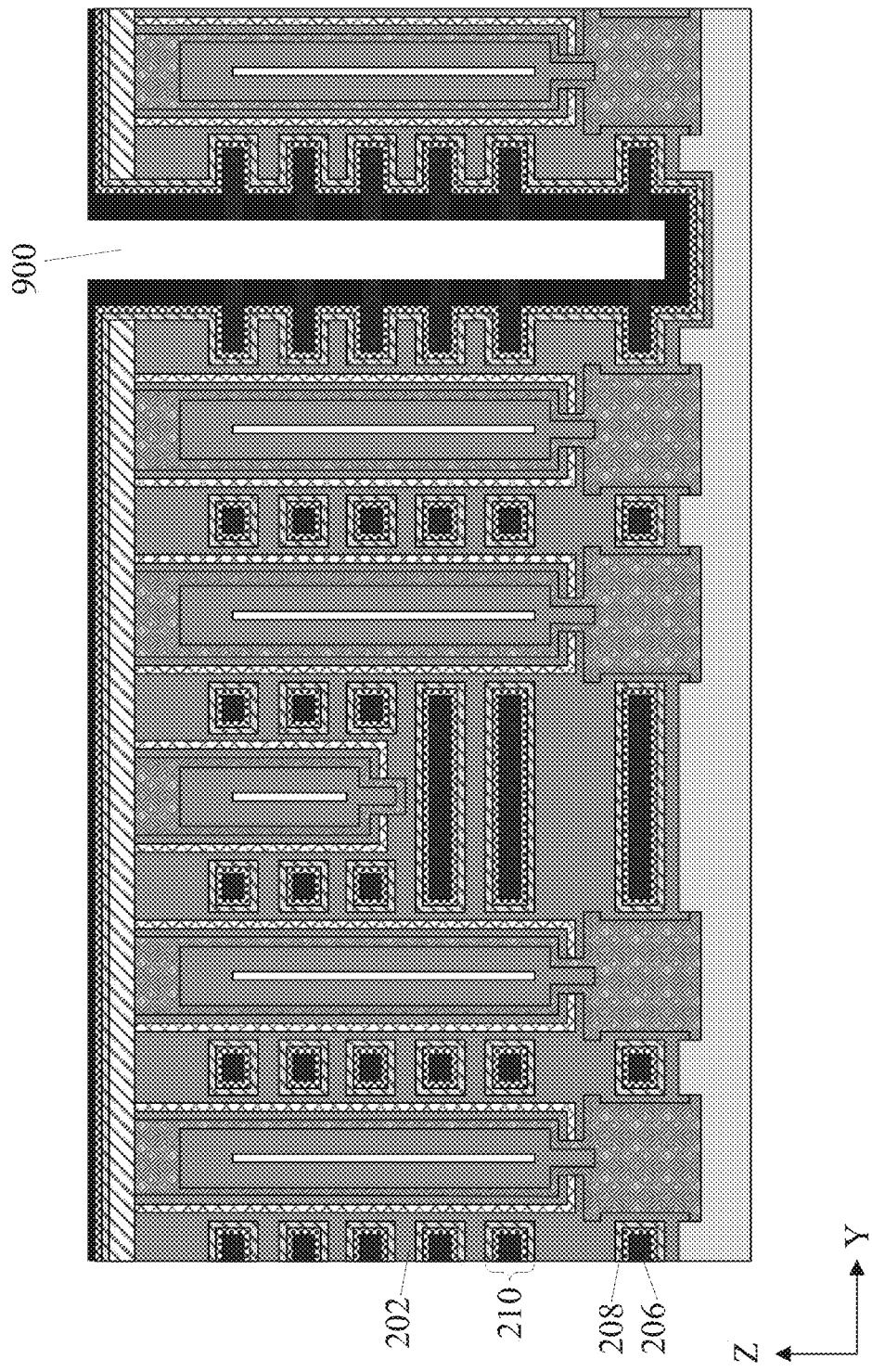

In some embodiments, a TSG cut structure 90 can be formed in the trench 400, as shown in FIG. 15. Comparing to the channel structure 50, the TSG cut structure 90 does not include an epitaxial layer on the bottom of the trench 400. The TSG cut structure 90 include two dummy functional layers 700' on both sidewalls of the trench 400 separately, two dummy channel layer 640' each on one of the two dummy functional layers 700' respectively, a dielectric filling wall 800' sandwiched between the two dummy channel layers 640', and a dummy channel strip cover 660' on the top portion of the trench 400. The dummy functional layer 700' can include a dummy barrier layer 720', a dummy storage layer 740', and a dummy tunneling layer 760'. As shown in FIG. 1(B), the TSG cut structure 90 can extend laterally in the X-direction. Further, as shown in FIG. 15, the TSG cut structure 90 in the trench 400 can have a height in the Z-direction much shorter than the channel structure 50 in the channel hole 500.

In some embodiments, the channel structure 50 and the TSG cut structure 90 can be formed simultaneously. Specifically, the functional layer 700 in the channel structure 50 and the dummy functional layers 700' of the TSG cut structure 90 are formed simultaneously. That is, the barrier layer 720 and the dummy barrier layer 720' are formed simultaneously in a first deposition process, the dummy storage layer 740 and the dummy storage layer 740' are formed simultaneously in a second deposition process, and the dummy tunneling layer 760 and the dummy tunneling layer 760' are formed simultaneously in a third deposition process. Further, the channel layer 640 in each channel hole 500 and the dummy channel layer 640' in the trench 400 are formed simultaneously, the dielectric filling structure 800 in each channel hole 500 and the dielectric filling wall 800' in the trench 400 are formed simultaneously, and the channel plug 660 on the top portion of each channel hole 500 and the dummy channel strip cover 660' on the top portion of the trench 400 are formed simultaneously.

In some embodiments, the fabricating processes for simultaneously forming the channel structure 50 and the TSG cut structure 90 are described in detail in the following in connection with FIGS. 9-14.

Figure 9:
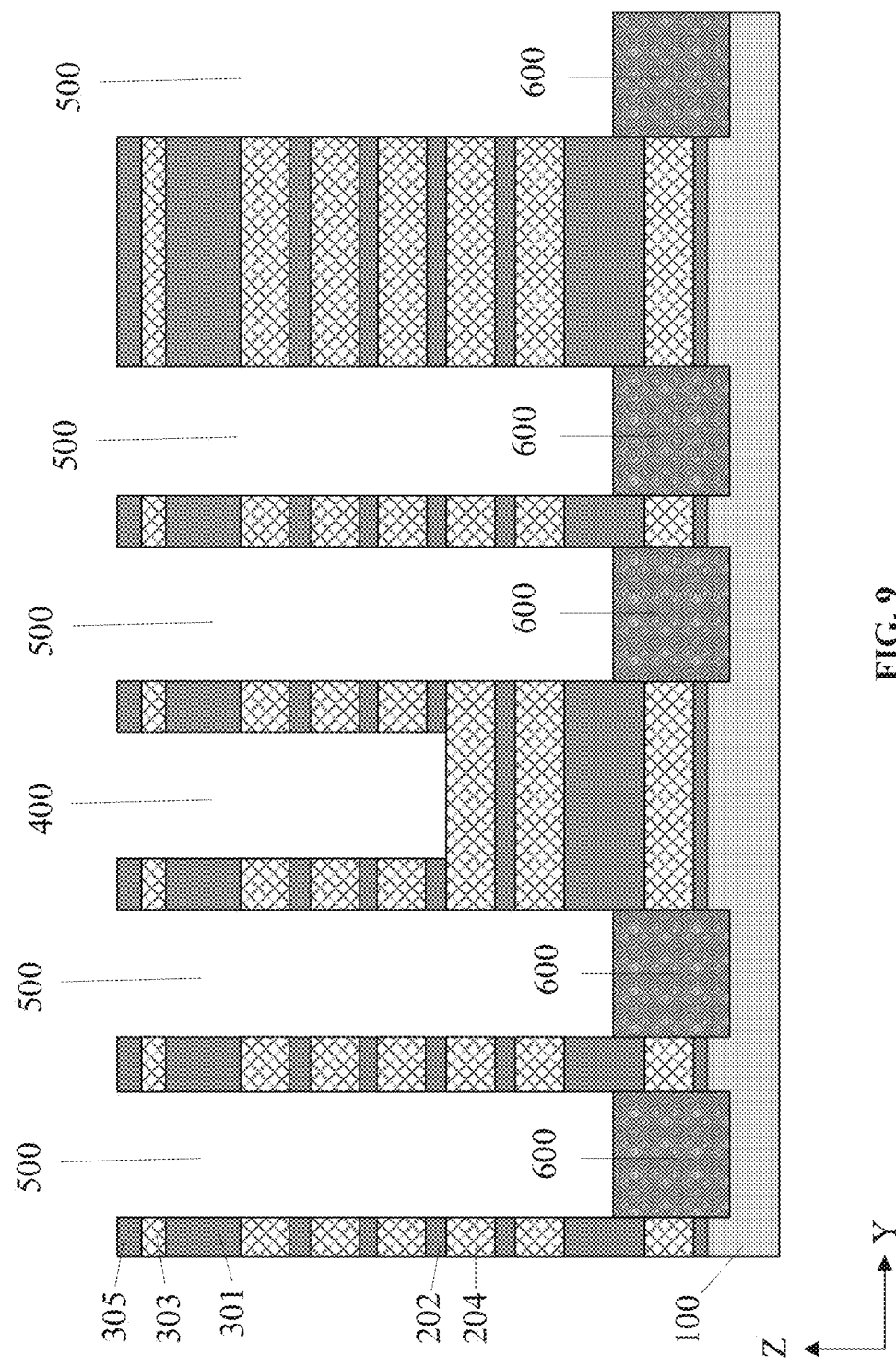

As shown in FIG. 9, an epitaxial layer 600 can be formed on the bottom of the each channel hole 500 and on the substrate 100 that is exposed by the channel hole 500. In some embodiments, the epitaxial layer 600 can be a polycrystalline silicon (polysilicon) layer formed by a selective epitaxial growth (SEG) process. In some embodiments, the epitaxial layer 600 may not be directly formed on the surface of the substrate 100. One or more layers can be formed between the epitaxial layer 600 and the substrate 100. That is, the epitaxial layer 600 overlays the substrate 100. It is noted that, since the trench 400 does not expose a surface of the substrate 100, the epitaxial layer 600 does not formed in the bottom of the trench 40.

Figure 10:
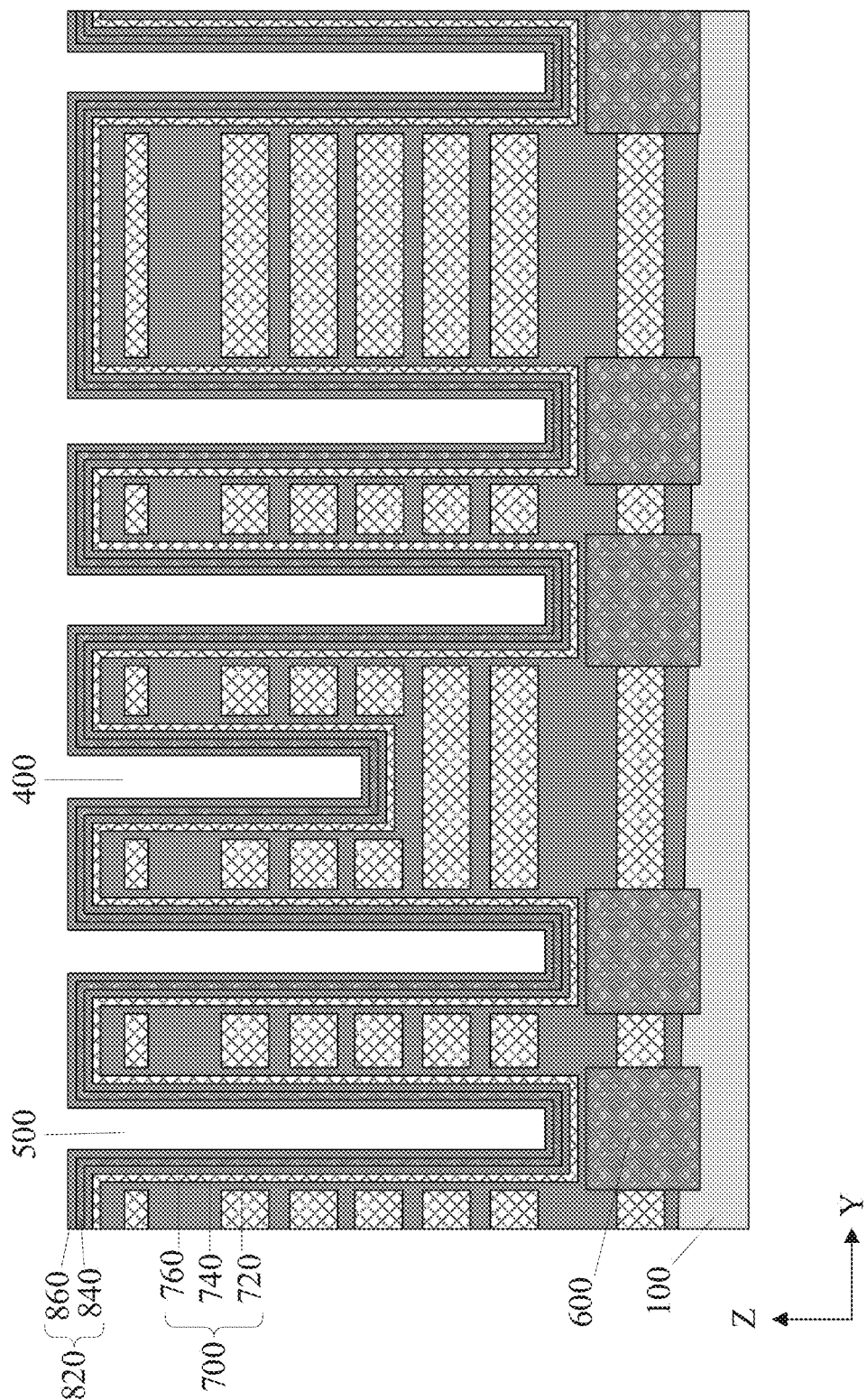

As shown in FIG. 10, a functional layer 700 can be formed covering the sidewall of each channel hole 500, the top surface of the epitaxial layer 600 in each channel hole 500, as well as the sidewalls and the bottom surface of the trench 400. In some embodiments, the functional layer 700 can include a barrier layer 720, a storage layer 740, and a tunneling layer 760, and can be formed on the sidewall of the channel hole 500. In some embodiments, the barrier layer 720, the storage layer 740, and the tunneling layer 760 can be formed by any suitable thin film deposition processes successively, such as chemical vapor deposition (CVD) processes, physical vapor deposition (PVD) processes, atomic layer deposition (ALD) processes, or any suitable combination thereof. The barrier layer 720 can be formed to cover the sidewall of each channel hole 500, the top surface of the epitaxial layer 600 in each channel hole 500, as well as the sidewalls and the bottom of the trench 400. The storage layer 740 can be formed to cover the barrier layer 720, and the tunneling layer 760 can be formed to cover the storage layer 740.

The barrier layer 720 can be used for blocking the outflow of the electronic charges. In some embodiments, the barrier layer 720 can be a silicon oxide layer or a combination of silicon oxide/silicon oxynitride/silicon oxide ($SiO_2$—SiON—$SiO_2$) multi-layer stack. In some embodiments, the barrier layer 720 includes high dielectric constant (high-k) dielectrics (e.g., aluminum oxide). In one example, the barrier layer 7 is mainly an oxide layer formed by In-Situ Steam Generation (ISSG) oxidation after a silicon nitride deposition process. In some embodiments, a thickness of the barrier layer 720 can be less than 20 nm.

The storage layer 740 can be used for storing electronic charges. The storage and/or removal of charges in the storage layer 740 can impact the on/off state and/or a conductance of the semiconductor channel. The storage layer 740 can include polycrystalline silicon (polysilicon) or silicon nitride. The storage layer 740 can include one or more films of materials including, but are not limited to, silicon nitride, silicon oxynitride, a combination of silicon oxide and silicon nitride, or any combination thereof. In some embodiments, the storage layer 740 can include a nitride layer formed by using one or more deposition processes.

The tunneling layer 760 can be used for tunneling electronic charges (electrons or holes). The tunneling layer 760 can be dielectric materials including, but not limited to, silicon oxide, silicon nitride, silicon oxynitride, or any combination thereof. In some embodiments, the tunneling layer 76 can be an oxide layer formed by using a deposition process. In some embodiments, a thickness of the tunneling layer 760 can be less than 20 nm.

Figure 11:
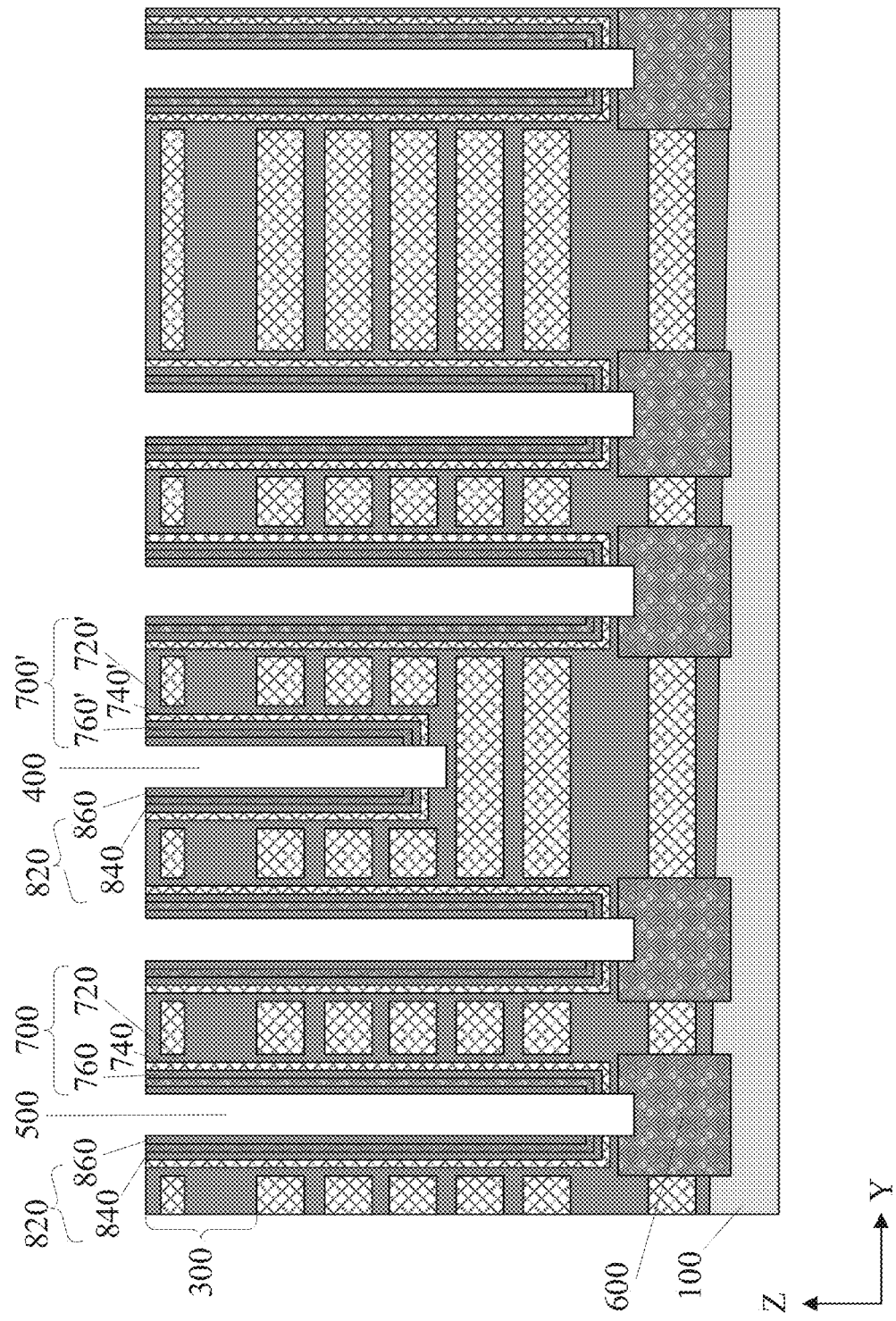

In some embodiment, a protecting layer 820 can be formed to cover the functional layer 700. The protecting layer 820 can protect the functional layer 700 from being damaged in a subsequent etching process. As shown in FIG. 11, the protecting layer can include a first channel layer 840 covering the functional layer 700, and a mask layer 860 covering the first channel layer 840. In some embodiments, the first channel layer 840 can include amorphous silicon, polycrystalline silicon, and/or monocrystalline silicon. The first channel layer 840 can be formed by using a thin film deposition process, such as ALD, CVD, PVD, or any other suitable process. In some embodiments, a thickness of the first channel layer 820 can be in a range from about 5 nm to about 20 nm.

In some embodiments, a mask layer 860 can be formed to cover the first channel layer 840 to protect the first channel layer 840 from being damaged in a subsequent removal process. In some embodiments, the mask layer 860 can be a silicon oxide layer formed by using a thin film deposition process, such as ALD, CVD, PVD, or any other suitable process. In some embodiments, a thickness of the mask layer 860 can be in a range from about 5 nm to about 20 nm.

As shown in FIG. 11, portions of the functional layer 700 and the protecting layer 820 that are outside of the channel holes 500 and the trench 400 can be removed by any suitable techniques, such as backside grinding, and/or chemical mechanical polishing (CMP), etc. Further, portions of the functional layer 700 and the protecting layer 820 on the bottom of each channel hole 500 can be removed to form a recess that exposes or extends into the epitaxial layer 600. In some embodiments, the portions of the functional layer 700 and the protecting layer 820 can be removed by any suitable etching process, such as a dry etch (e.g., a punch etch) and/or a wet etch. In some embodiment, a following chemical mechanical polishing (CMP) process can be performed to planarize the top surface of the channel connecting layer 300.

As shown in FIG. 11, the remaining portions of the barrier layer 720, the storage layer 740, and the tunneling layer 760 inside each channel hole 500 can form the functional layer 700. As shown in FIG. 1(B), the functional layer 700 in each channel hole 500 can have a multilayer-ring structure. As shown in FIG. 11, the remaining portions of the barrier layer 720' (dummy barrier layer 720'), the storage layer 740' (dummy storage layer 740'), and the tunneling layer 760' (dummy tunneling layer 760') inside the trench 400 can form two dummy functional layers 700'. As shown in FIG. 1(B), the dummy functional layer 700' can extend laterally in the X-direction. Not that, the two dummy functional layers 700' in the trench 400 do not perform any functions described above compared to the functional layer 700 in each channel hole 500.

Figure 12:
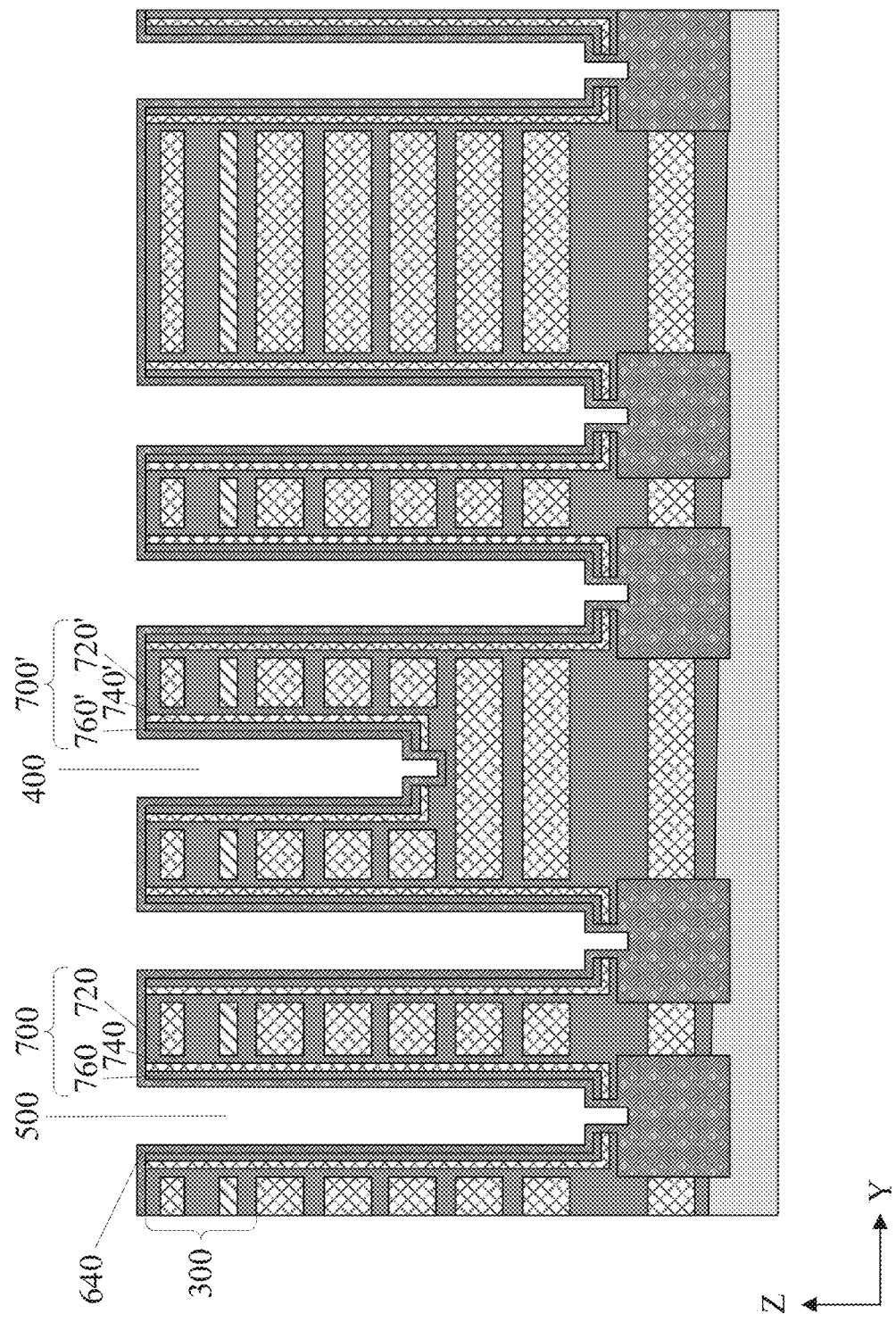

As shown in FIG. 12, the protecting layer 820 can be completely or partially removed. In some embodiments, the process of removing the protecting layer 820 can include grinding, dry etching, wet etching, or chemical mechanical polishing, or a combination thereof. Then, a second channel layer 640 can be formed covering the functional layer 700 and contacting to the epitaxial layer 600. The second channel layer 640 can be formed by any suitable thin film deposition processes including, but not limited to, chemical vapor deposition (CVD), physical vapor deposition. (PVD) or atomic layer deposition (ALD), or a combination thereof.

As shown in FIG. 12, the second channel layer 640 is also formed in the trench 400 to cover the dummy functional layer 700'. In some embodiments, a thickness of the second channel layer 640 can be in a range from about 10 nm to about 30 nm.

As shown in FIG. 13, a dielectric filling structure 800 can be formed to fill each channel hole 500, and a dielectric filling wall 800' can be formed to fill the trench 400. In some embodiments, the dielectric filling structures 800 and the dielectric filling wall 800' can be formed simultaneously by using at least two deposition processes. For example, a first atomic layer deposition (ALD) process and a following first etching back process can be performed to form lower portions of the dielectric filling structures 800 and the dielectric filling wall 800'. A second ALD process and a following second etching back process can be performed to form upper portions of dielectric filling structures 800 and the dielectric filling wall 80'. In some embodiments, the lower portions of the dielectric filling structures 800 and the dielectric filling wall 800' can include one or more airgaps. The top surfaces of the upper portions of dielectric filling structures 80 and the dielectric filling wall 800' can be lower than the top surface of the channel connecting layer 300. The material of the dielectric filling structures 800 and the dielectric filling wall 800' can include any suitable dielectric material, such as silicon oxide.

In some embodiments, portions of the dielectric filling structures 800 and the dielectric filling wall 800' close to the openings of the channel holes 500 and the trench 400 can be removed by the second etching back process (also referred as an recess etching process). The etching back process can include, but not limited to, a wet etching, a dry etching, or a combination thereof. As such, a round recess can be formed in each channel hole 500 and above the remaining portion of the dielectric filling structure 800. A groove can be formed in the trench 400 and above the remaining portion of the dielectric filling wall 800'. A following diluted hydrofluoric acid (HF) cleaning process can be performed to clean the round recesses and the groove.

Still as shown in FIG. 13, a top channel structure 680 can be formed to fill the round recesses in the channel holes 500 and the groove of the trench 400, and cover the top surface of the channel connecting layer 300. The top channel structure 680 can be an amorphous silicon layer or a polysilicon layer formed by using a thin film deposition process, such as a low pressure chemical vapor deposition (LPCVD) process; plasma enhanced chemical vapor deposition (PECVD) process. Atomic Layer Deposition (ALD) or any other suitable processes. The top channel structure 680 is in contact with the second channel layer 640.

Figure 14:
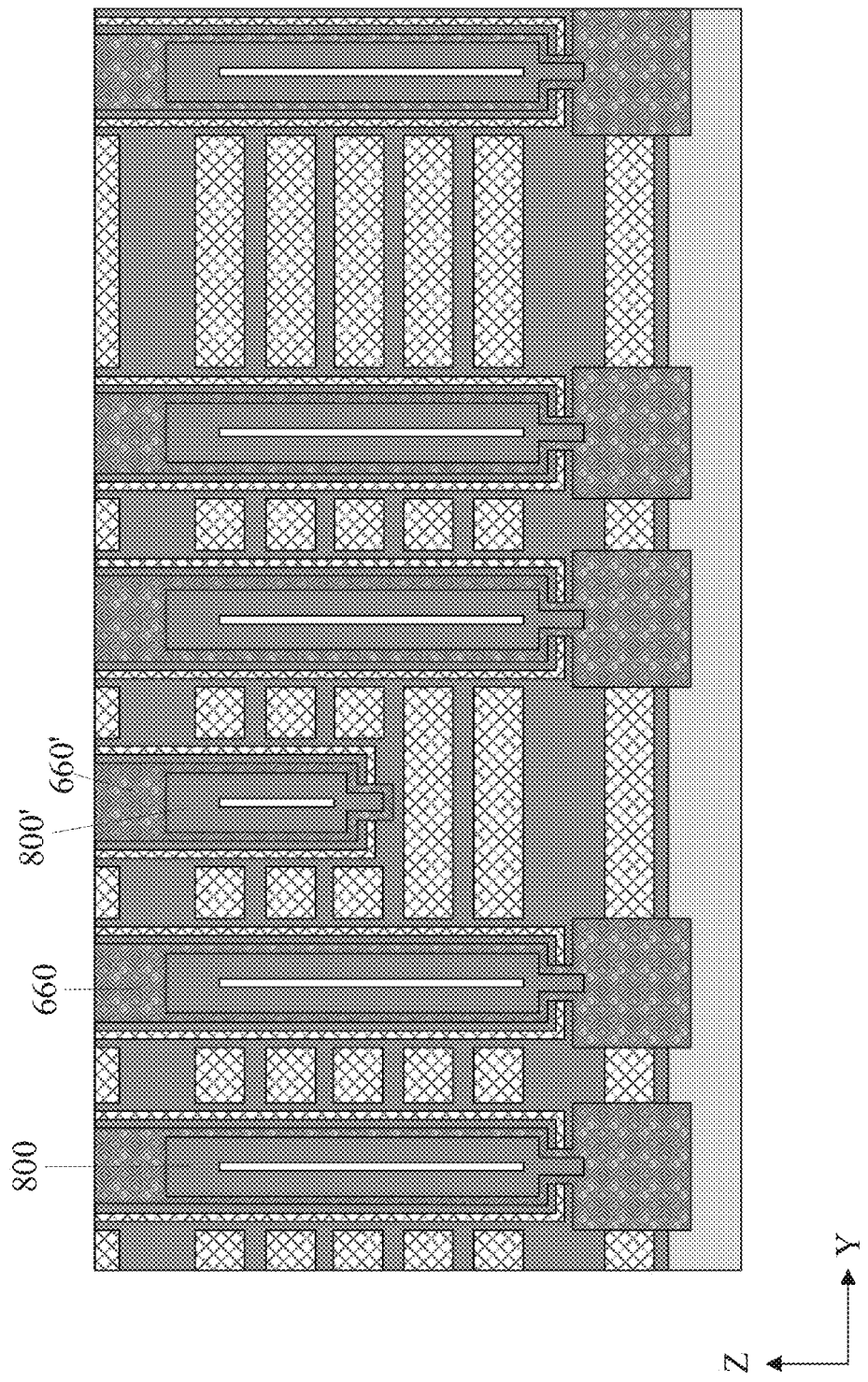

As shown in FIG. 14, the top surface of the top channel structure 680 can be planarized by any suitable techniques, such as backside grinding, and/or chemical mechanical polishing (CMP). As such, an upper portion of the top channel structure 680 outside the channel holes 500 and the trench 400 can be removed. The remaining portion of the top channel structure 680 inside each channel hole 500 can form a channel plug 660 that has a column shape. The remaining portion of the top channel structure 680 inside the trench 400 can form a dummy channel strip cover 660' that has a shape of long stripe.

Accordingly, multiple channel structures 50 and the TSG cut structure 90 are formed simultaneously. In the cross sectional view along the Y-Z plane as shown in FIG. 14, the channel structures 50 and the TSG cut structure 90 have similar structures. For example, each channel structure 50 includes functional layer 700, channel layer 640, dielectric filling structure 800, and channel plug 660, while the TSG cut structure 90 includes dummy functional layers 700', dummy channel layers 640', dielectric filling wall 800', and dummy channel strip cover 660'. However, in a 3D view, each channel structures 50 has a multilayer-ring structure, while the TSG cut structure 90 has a laminated structure extending along the X-direction which is perpendicular to the Y-Z plane as shown in FIG. 14. Further, in Z-direction, each channel structures 50 vertically penetrates the entire alternating dielectric stack 200, while the TSG cut structure 90 only extends into top few layers of the alternating dielectric stack 200.

Referring back to FIG. 2, in a next operation S160, the alternating dielectric stack can be transformed into an alternating layer stack including multiple conductive/dielectric layer pairs. In some embodiments, a gate replacement process (also known as the "word line replacement" process) can be performed to replace second dielectric layers 204 (e.g., silicon nitride) of the alternating dielectric stack 200 with gate structures 210. A detailed process of the gate replacement process is described in the following.

As shown in FIG. 15, multiple slits 900 can be formed in the alternating dielectric stack 200. In some embodiment, each slit 900 can vertically penetrate through the alternating dielectric stack 200, and extend substantially in a straight line between two arrays of channel structures. The multiple slits 900 can be formed by forming a mask layer over the alternating dielectric stack 200 and patterning the mask using, e.g., photolithography, to form openings corresponding to the multiple slits in the patterned mask layer. A suitable etching process, e.g., dry etch and/or wet etch, can be performed to remove portions of the alternating dielectric stack 200 exposed by the openings until the multiple expose the substrate 100. The mask layer can be removed after the formation of the multiple slits.

After forming the multiple slits 900, the second dielectric layers 204 in the alternating dielectric stack 200 can be removed to form multiple lateral trenches. The multiple lateral trenches can extend in a lateral direction, and can be used as spaces for a gate structure to be formed in the subsequent processes. It is noted that, the term "lateral/laterally" used herein means the X-Y plane. The second dielectric layers 204 in the alternating dielectric stack 200 are used as sacrificial layers, and are removed by used any suitable etching process, e.g., an isotropic dry etch or a wet etch. The etching process can have sufficiently high etching selectivity of the material of the second dielectric layers 204 over the materials of the first dielectric layer 202, such that the etching process can have minimal impact on the first dielectric layer 202. The isotropic dry etch and/or the wet etch and a following cleaning process can remove second dielectric layers 204 in various directions to expose the top and bottom surfaces of each first dielectric layer 202. As such, multiple lateral trenches can then be formed between first dielectric layers 202.

Multiple gate structures 210 can be formed in the multiple lateral trenches. In some embodiments, each gate structure 210 can have a laminated structure including one or more insulating layers 208 and a conductive layer 206.

In some embodiments, one or more insulating layers 208 can be formed in each of the multiple lateral trenches. The insulating layers 208 can be used as gate dielectric layers for insulating the respective word line (i.e., gate electrode) formed in the subsequent processes from the adjacent first dielectric layer 202. In some embodiments, one or more the insulating layers 208 can be formed to cover the exposed surfaces of the lateral trenches as shown in FIG. 15 with one or more suitable insulating materials. For example, one or more suitable deposition processes, such as CVD, PVD, and/or ALD, can be utilized to deposit the one or more insulating materials (e.g., high k-value dielectrics) into the lateral trenches.

In some embodiments, a conductive layer 206 can be formed in each lateral trench between the one or more insulating layers 208. The conductive layer 206 can be formed by filling the lateral trenches with a suitable gate electrode metal material. The conductive layer 206 can provide the base material for the subsequently-formed word lines (i.e., gate electrodes). The gate electrode metal material can include any suitable conductive material, e.g., tungsten, aluminum, copper, cobalt, or any combination thereof, for forming the word lines (i.e., gate electrodes). The gate electrode material can be deposited into lateral trenches using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layers 206 include tungsten formed by CVD.

In some embodiments, any suitable subsequent processed can be performed to further fabricating the structure shown in FIG. 15. For example, spacer layers can be formed on the sidewalls of the multiple slits 900, and a conductive wall can be formed in each of the multiple slits 900.

Accordingly, a method for forming a 3D memory device is disclosed. By simultaneously forming the channel structures and the top selective gate (TSG) cuts, the inner and outer channel hole etch loading can be improved, and a traditional TSG cut ALD filling process can be skipped. Further, without occupying the location of a row of channel structures, the TSG cut can be arranged between adjacent channel structures in each memory finger. By reducing the number of channel structures in each memory finger, the channel hole pattern density can be decreased during the formation of the channel structures, thereby reducing an area of each memory finger by about 5%-10%. Therefore, the size requirement of the wafer can be decreased without lowing the storage capacity, which thereby results in a reduced size of the 3D NAND memory device, and a reduced cost. Further, the reduced area of each memory finger can facilitate the gate replacement process during the formation of word lines by decreasing a removal over etch rate, and resulting in a decreased process cycle time.

One aspect of the present disclosure provides a method for forming a three-dimensional (3D) memory device. The method can comprises: forming an alternating dielectric stack on a substrate; forming a temporary top selective gate cut in an upper portion of the alternating dielectric stack and extending along a lateral direction; forming a plurality of channel holes penetrating the alternating dielectric stack; removing the temporary top selective gate cut; and forming, simultaneously, a plurality of channel structures in the plurality of channel holes and a top selective gate cut structure.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, forming the temporary top selective gate cut comprises: forming a trench in an upper portion of the alternating dielectric stack and extending along the lateral direction; and forming a sacrificial wall in the trench.

In some embodiments, forming the trench comprises: etching top three dielectric layer pairs of the alternating dielectric stack to form the trench.

In some embodiments, forming the sacrificial wall comprises: disposing a filling material into the trench to form the sacrificial wall; wherein the filling material is stable physically and chemically within a temperature range between about 200° C. to about 400° C.

In some embodiments, disposing the filling material comprises depositing a carbonaceous inorganic substance mixed with a solvent.

In some embodiments, removing the temporary top selective gate cut comprises: performing an ashing process to simultaneously clean the plurality of channel holes and remove the sacrificial wall.

In some embodiments, simultaneously forming the plurality of channel structures and the top selective gate cut structure comprises: simultaneously forming a functional layer on sidewalls of the plurality of channel holes and forming a dummy functional layer on sidewalls of the trench, followed by; simultaneously forming a channel layer covering the functional layer in each channel hole and forming a dummy channel layer covering the dummy functional layer in the trench, followed by; simultaneously forming a dielectric filling structure filling each channel hole and forming a dielectric filling wall filling the trench, followed by; and simultaneously forming a channel plug on a top portion of each channel hole on the dielectric filling wall and forming a dummy channel strip cover on the dielectric filling wall in the trench.

In some embodiments, the method further comprises: before forming the functional layer, forming an epitaxial layer on a surface of the substrate that is exposed by the plurality of channel holes. In some embodiments, the channel layer is in contact with the epitaxial layer in each channel hole, each channel structure includes the epitaxial layer, the functional layer, the channel layer, the dielectric filling structure, and the channel plug; and the top selective gate cut structure includes the dummy functional layer, the dummy channel layer, the dielectric filling wall, and the dummy channel strip cover.

In some embodiments, simultaneously forming the functional layer and the dummy functional layer comprises: simultaneously forming a barrier layer on the sidewalls of the plurality of channel holes and forming a dummy barrier layer on the sidewalls of the trench, followed by; simultaneously forming a storage layer on a surface of the barrier layer in each channel hole and forming a dummy storage layer on a surface of the dummy barrier layer in the trench, followed by: and simultaneously forming a tunneling layer on a surface of the storage layer in each channel hole and forming a dummy tunneling layer on a surface of the dummy storage layer in the trench.

In some embodiments, the method further comprises: forming a pair of slits penetrating the alternating dielectric stack, the pair of slits being extended in parallel along the lateral direction. In some embodiments, a number N of rows of channel structures are formed between the pair of slits, wherein each row of channel structures are arranged staggered with adjacent row of channel structures, and N is an even number; and the top selective gate cut structure is formed between number N/2 row of channel structures and number N/2+1 row of channel structures.

In some embodiments, the method further comprises: replacing the second dielectric layers in the alternating dielectric with conductive layers.

Another aspect of the present disclosure provides a three-dimensional (3D) memory device, comprising: an alternating layer stack on a substrate; a plurality of channel holes penetrating the alternating layer stack; a channel structure in each channel hole; and a top selective gate cut structure having a laminated structure and located between two rows of channel structures.

In some embodiments, the alternating layer stack comprises: at least 32 conductive/dielectric layer pairs stacked in a vertical direction, wherein each conductive/dielectric pair includes a dielectric layer and a conductive layer.

In some embodiments, the top selective gate cut structure extends into three top conductive/dielectric layer pairs of the alternating layer stack.

In some embodiments, the channel structure comprises: an epitaxial layer on a bottom of the channel hole; a functional layer on a sidewall of the channel hole; a channel layer covering a sidewall of the functional layer and being in contact with the epitaxial layer; a dielectric filling structure covering a sidewall of the channel layer and filling the channel hole; and a channel plug on a top portion of the channel hole.

In some embodiments, the top selective gate cut structure comprises: a dummy functional layer covering sidewalls and a bottom of a trench; a dummy channel layer covering the dummy functional layer; a dielectric filling wall, and a dummy channel strip cover on a top portion of the trench.

In some embodiments, the functional layer and the dummy functional layer have a same material and are formed in a same process; the channel layer and the dummy channel layer have a same material and are formed in a same process; a dielectric filling structure and the dielectric filling wall have a same material and are formed in a same process; and the channel plug and the dummy channel strip cover have a same material and are formed in a same process.

In some embodiments, the functional layer comprises: a barrier layer on the sidewall of the first channel hole configured to block an outflow of electronic charges; a storage layer on a surface of the first barrier layer configured to store electronic charges during operation of the 3D memory device; and a tunneling layer on a surface of the first storage layer configured to tunnel electronic charges.

In some embodiments, the device further comprises; a pair of slits penetrating the alternating layer stack, the pair of slits being extended in parallel along the lateral direction. In some embodiments, a number N of rows of channel structures are located between the pair of slits, each row of channel structures are arranged staggered with adjacent row of channel structures, and N is an even number; and the top selective gate cut structure is located between number N/2 row of channel structures and number N/2+1 row of channel structures.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   an alternating layer stack on a substrate;
   a plurality of channel holes penetrating the alternating layer stack;
   a channel structure in each channel hole, wherein channel structures are arranged as rows along a lateral direction; and
   a top selective gate cut structure, having a laminated structure, extends along the lateral direction and is located separate from the rows and between two of the rows.

2. The 3D memory device of claim 1, wherein the alternating layer stack comprises:
   at least 32 conductive/dielectric layer pairs stacked in a vertical direction, wherein each conductive/dielectric pair includes a dielectric layer and a conductive layer.

3. The 3D memory device of claim 1, wherein:
   the top selective gate cut structure extends into three top conductive/dielectric layer pairs of the alternating layer stack.

4. The 3D memory device of claim 1, wherein the channel structure comprises:
   an epitaxial layer on a bottom of the each channel hole;
   a functional layer on a sidewall of the each channel hole;
   a channel layer covering a sidewall of the functional layer and being in contact with the epitaxial layer;
   a dielectric filling structure covering a sidewall of the channel layer and filling the each channel hole; and
   a channel plug on a top portion of the each channel hole.

5. The 3D memory device of claim 4, wherein the top selective gate cut structure comprises:
   a dummy functional layer covering sidewalls and a bottom of a trench;
   a dummy channel layer covering the dummy functional layer;
   a dielectric filling wall, and
   a dummy channel strip cover on a top portion of the trench.

6. The 3D memory device of claim 5, wherein:
   the functional layer and the dummy functional layer have a same material and are formed in a same process;
   the channel layer and the dummy channel layer have a same material and are formed in a same process;
   a dielectric filling structure and the dielectric filling wall have a same material and are formed in a same process; and
   the channel plug and the dummy channel strip cover have a same material and are formed in a same process.

7. The 3D memory device of claim 4, wherein the functional layer comprises:
   a barrier layer on the sidewall of the each channel hole configured to block an outflow of electronic charges;
   a storage layer on a surface of the barrier layer configured to store electronic charges during operation of the 3D memory device; and
   a tunneling layer on a surface of the storage layer configured to tunnel electronic charges.

8. The 3D memory device of claim 1, further comprising:
   a pair of slits penetrating the alternating layer stack, the pair of slits being extended in parallel along the lateral direction;
   wherein a number N of the rows are located between the pair of slits, each row of channel structures are arranged staggered with an adjacent row of channel structures, and N is an even number; and
   wherein the top selective gate cut structure is located between number N/2 row of channel structures and number N/2+1 row of channel structures.

* * * * *